US008569758B2

(12) United States Patent
Sun et al.

(10) Patent No.: US 8,569,758 B2
(45) Date of Patent: Oct. 29, 2013

(54) TOUCHING-TYPE ELECTRONIC PAPER AND METHOD FOR MANUFACTURING THE SAME

(75) Inventors: Zenghui Sun, Beijing (CN); Wenjie Hu, Beijing (CN); Zhuo Zhang, Beijing (CN); Gang Wang, Beijing (CN); Xibin Shao, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 303 days.

(21) Appl. No.: 12/557,319

(22) Filed: Sep. 10, 2009

(65) Prior Publication Data

US 2010/0155731 A1 Jun. 24, 2010

(30) Foreign Application Priority Data

Dec. 24, 2008 (CN) .......................... 2008 1 0240965

(51) Int. Cl.
*H01L 29/04* (2006.01)
(52) U.S. Cl.
USPC ............. 257/59; 257/222; 257/257; 257/350; 257/359
(58) Field of Classification Search
USPC ............ 257/59, 222, 257, 350, 359, E51.005, 257/E29.202, E29.273
See application file for complete search history.

(56) References Cited

U.S. PATENT DOCUMENTS

| 5,838,414 | A | * | 11/1998 | Lee | 349/157 |
| 6,493,050 | B1 | * | 12/2002 | Lien et al. | 349/106 |
| 6,583,846 | B1 | * | 6/2003 | Yanagawa et al. | 349/155 |
| 6,801,290 | B2 | * | 10/2004 | Kim et al. | 349/156 |
| 7,190,008 | B2 | * | 3/2007 | Amundson et al. | 257/226 |
| 7,208,764 | B2 | * | 4/2007 | Furusawa | 257/72 |
| 7,593,078 | B2 | * | 9/2009 | Ochiai et al. | 349/114 |
| 7,838,328 | B2 | * | 11/2010 | Isa | 438/99 |
| 7,859,510 | B2 | * | 12/2010 | Umezaki | 345/100 |
| 8,058,652 | B2 | * | 11/2011 | Honda | 257/66 |
| 2003/0048370 | A1 | * | 3/2003 | Koyama | 348/311 |

(Continued)

FOREIGN PATENT DOCUMENTS

| CN | 1345026 A | 4/2002 |
| EP | 1 184 714 A2 | 3/2002 |
| JP | 2002-149115 A | 5/2002 |
| JP | 2008-003124 A | 1/2008 |

*Primary Examiner* — Fernando L Toledo
*Assistant Examiner* — Mohammed Shamsuzzaman
(74) *Attorney, Agent, or Firm* — Ladas & Parry LLP

(57) ABSTRACT

The present invention relates to a touching-type electronic paper and method for manufacturing the same. The touching-type electronic paper includes a TFT substrate and a transparent electrode substrate which are disposed as a cell. The transparent electrode substrate includes a common electrode, microcapsule electronic ink and light guiding poles as light transmitting passages, all of which are formed on a first substrate. The TFT substrate comprises displaying electrodes, first TFTs for driving the displaying electrodes, second TFTs for detecting lights transmitting through the light guiding poles and for producing level signals, and third TFTs for reading the level signals and sending the level signals to a back-end processing system, all of which are formed on a second substrate. The light guiding poles are opposite to the second TFTs respectively. The present invention makes the natural lights or other lights outside transmitted to the second TFTs through the light guiding poles by disposing the light guiding poles as light transmitting passages and disposing the second TFTs as light sensor units. The present invention has many advantages such as simple structure, simple manufacturing process and low cost, so as to have a wide application prospect.

4 Claims, 6 Drawing Sheets

(56) References Cited

U.S. PATENT DOCUMENTS

| | | | |
|---|---|---|---|
| 2003/0123018 A1* | 7/2003 | Kim et al. | 349/155 |
| 2006/0033876 A1* | 2/2006 | Park et al. | 349/155 |
| 2007/0001941 A1* | 1/2007 | Umezaki et al. | 345/77 |
| 2008/0123007 A1* | 5/2008 | Cui et al. | 349/43 |
| 2008/0123030 A1* | 5/2008 | Song | 349/110 |
| 2008/0129933 A1* | 6/2008 | Nishida et al. | 349/96 |
| 2008/0191212 A1* | 8/2008 | Lee et al. | 257/59 |
| 2008/0259051 A1* | 10/2008 | Ota | 345/175 |
| 2009/0078937 A1* | 3/2009 | Saito et al. | 257/59 |
| 2009/0086134 A1* | 4/2009 | Yao et al. | 349/106 |
| 2009/0102008 A1* | 4/2009 | Kakehata | 257/506 |
| 2009/0115741 A1* | 5/2009 | Wang et al. | 345/173 |
| 2009/0122282 A1* | 5/2009 | Nishii | 355/30 |
| 2009/0146967 A1* | 6/2009 | Ino et al. | 345/173 |
| 2009/0146992 A1* | 6/2009 | Fukunaga et al. | 345/214 |
| 2009/0224245 A1* | 9/2009 | Umezaki | 257/59 |
| 2009/0283689 A1* | 11/2009 | Mochizuki et al. | 250/370.14 |
| 2010/0164921 A1* | 7/2010 | Ino et al. | 345/207 |
| 2010/0194721 A1* | 8/2010 | Miyata et al. | 345/206 |
| 2010/0248405 A1* | 9/2010 | Tanaka | 438/34 |
| 2010/0283717 A1* | 11/2010 | Oka et al. | 345/102 |
| 2011/0017919 A1* | 1/2011 | Mochizuki et al. | 250/370.14 |
| 2011/0084266 A1* | 4/2011 | Yamazaki et al. | 257/43 |
| 2011/0088770 A1* | 4/2011 | Allemand et al. | 136/256 |
| 2011/0157097 A1* | 6/2011 | Hamada et al. | 345/175 |
| 2011/0233540 A1* | 9/2011 | Yamazaki | 257/43 |
| 2011/0260169 A1* | 10/2011 | Umezaki et al. | 257/59 |
| 2011/0272699 A1* | 11/2011 | Akimoto et al. | 257/59 |
| 2011/0297642 A1* | 12/2011 | Allemand et al. | 216/13 |

* cited by examiner

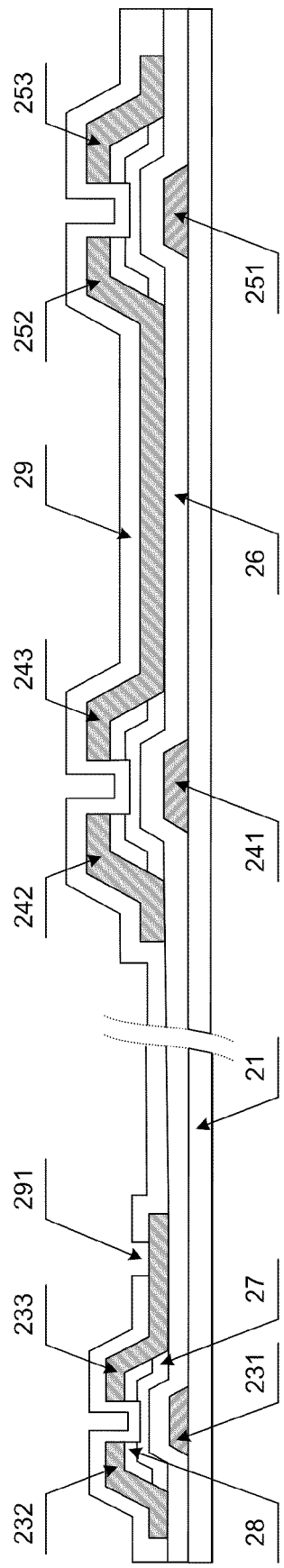
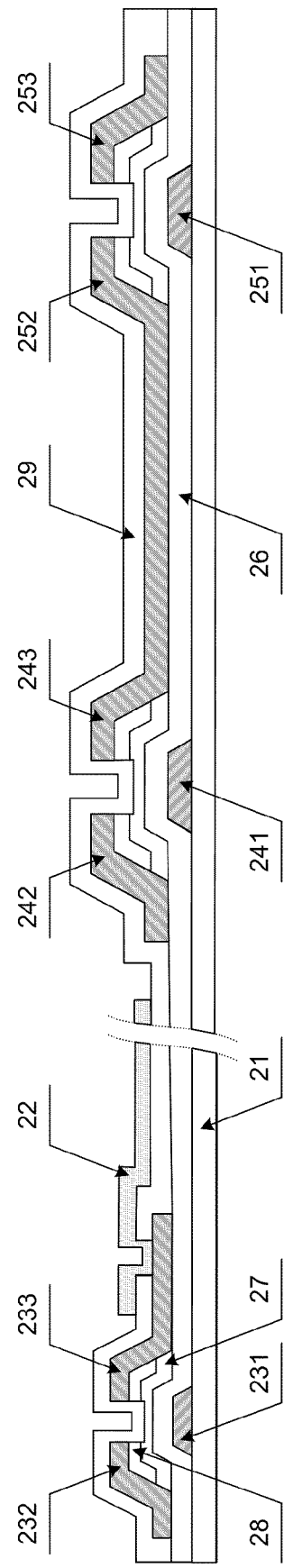
Fig. 10
Fig. 11

TOUCHING-TYPE ELECTRONIC PAPER AND METHOD FOR MANUFACTURING THE SAME

CROSS-REFERENCE TO RELATED APPLICATIONS

This application claims priority to Chinese Patent Application No. 200810240965.2, filed on Dec. 24, 2008, entitled "Touching-Type Electronic Paper and Method for Manufacturing the Same", which is hereby incorporated by reference in its entirety.

FIELD OF THE TECHNOLOGY

The present invention relates to an electronic paper and method for manufacturing the same, and particularly to a touching-type electronic paper and method for manufacturing the same.

BACKGROUND

Electronic paper (E-Paper) is also called digital paper, which is a production combining an information displaying characteristic of general pager with a characteristic of a computer display screen. Conventional printing productions are mainly accomplished by papers, so the environment is badly destroyed along with the papers are used more and more. The electronic paper has the same characteristic with the papers, displaying, and could be used repeatedly, so it could not badly destroy the environment, and the electronic paper could display dynamitic image. Therefore, the electronic paper has a foreground to replace conventional paper documents soon. The electronic paper based on an electrophoretic technology accomplishes displaying by electrophoretic phenomenon, of which a working principle is to respectively drive color particles having positive or negative charge in microcapsule electronic ink to move up and down by electric field, and black particles and white particles respectively display black or white by reflecting and absorbing natural lights. As the electrophoretic displaying technology takes advantage of reflecting lights to display, energy consumption is very low. Prior to now, as the advantages such as low energy consumption and similar displaying effect with the papers, the electronic paper displaying technology based on the microcapsule electronic ink has a wide application prospect.

A built-in type touch panel has gradually been a new developing trend of a touch panel in recent years. The built-in type touch panel has the advantages such as reducing complexity of manufacturing process, reducing displaying distortion, producing lighter and thinner product and so on by disposing sensors inside a display screen, for example, directly manufacturing on a thin film transistor (TFT) substrate. Based on the display characteristic of the electronic paper, the natural lights are reflected and/or absorbed when they pass through the microcapsule electronic ink, so they could not reach the TFT substrate. Therefore, there is not any technical solution to combine a light sensing built-in type touch panel with the electronic paper in the conventional technology.

SUMMARY

The subject of the present invention is to provide a touching-type electronic paper and method for manufacturing the same, so as to combine a built-in type touch panel with an electronic paper organically, and make the product have advantages such as simple structure, simple manufacturing process, low cost and so on.

In order to accomplish the above subject, the present invention provides a touching-type electronic paper including a TFT substrate and a transparent electrode substrate disposed as a cell, wherein the transparent electrode substrate includes a common electrode, microcapsule electronic ink and light guiding poles as light transmitting passages, all of which are formed on a first substrate; the TFT substrate includes displaying electrodes, first TFTs for driving the displaying electrodes respectively, second TFTs for detecting lights transmitting through the light guiding poles and for producing level signals respectively, and third TFTs for reading the level signals and sending the level signals to a back-end processing system, all of which are formed on a second substrate; and the light guiding poles are opposite to the second TFTs respectively.

The common electrode is formed on the first substrate, the light guiding poles made of transparent material are formed on the common electrode, and the other part of the common electrode where no light guiding pole is coated with the microcapsule electronic ink. A height of the light guiding poles is 35%-65% of a distance between the TFT substrate and the transparent electrode substrate. Preferably, the height of the light guiding poles is 50% of the distance between the TFT substrate and the transparent electrode substrate.

Each of the first TFTs includes:

a first gate electrode formed on the second substrate and connected to a first gate line;

a gate insulation layer formed on the first gate electrode and covering the entire second substrate;

a first active layer including a semiconductor layer and a doped semiconductor layer, formed on the gate insulation layer and located over the first gate electrode;

a first source electrode, of which one end is located on the first active layer and the other end is connected to a data line;

a first drain electrode, of which one end is located on the first active layer and the other end is connected to the displaying electrode;

a first TFT channel region, formed between the first source electrode and the first drain electrode, wherein the doped semiconductor layer between the first source electrode and the first drain electrode is entirely etched off to expose the semiconductor layer; and a passivation layer formed on the first source electrode and the first drain electrode, covering the entire second substrate and provided with a passivation layer via hole for connecting the displaying electrode and the first drain electrode.

Each of the second TFTs includes:

a second gate electrode formed on the second substrate and connected to a second gate line;

a gate insulation layer formed on the second gate electrode and covering the entire second substrate;

a second active layer including a semiconductor layer and a doped semiconductor layer, formed on the gate insulation layer and located over the second gate electrode;

a second source electrode, of which one end is located on the second active layer, and the other end is connected to a power line;

a second drain electrode, of which one end is located on the second active layer and the other end is connected to a third source electrode of each third TFT;

a second TFT channel region formed between the second source electrode and the second drain electrode, wherein the doped semiconductor layer between the second source electrode and the second drain electrode is entirely etched off to expose the semiconductor layer; and a passivation layer formed on the second source electrode and the second drain electrode and covering the entire second substrate.

Each of the third TFTs includes:

a third gate electrode formed on the second substrate and connected to a third gate line;

a gate insulation layer formed on the third gate electrode and covering the entire second substrate;

a third active layer including a semiconductor layer and a doped semiconductor layer, formed on the gate insulation layer and located over the third gate electrode;

a third source electrode, of which one end is located on the third active layer and the other end is connected to a second drain electrode of each second TFT;

a third drain electrode, of which one end is located on the third active layer and the other end is connected to a signal line;

a third TFT channel region formed between the third source electrode and the third drain electrode, wherein the doped semiconductor layer between the third source electrode and the third drain electrode is entirely etched off to expose the semiconductor layer; and a passivation layer formed on the third source electrode and the third drain electrode and covering the entire second substrate.

In order to accomplish the above subject, the present invention further provides a method for manufacturing touching-type electronic paper. The method includes the following steps:

manufacturing a transparent electrode substrate including a common electrode and light guiding poles as light transmitting passages which are all formed on a first substrate;

manufacturing a TFT substrate including a displaying electrode, first TFTs as driving units, second TFTs as light sensor units and third TFTs as signal reading units, which are all formed one a second substrate; and disposing the transparent electrode substrate and the TFT substrate as a cell, in which the light guiding poles are opposite to the second TFTs respectively.

The step of manufacturing the transparent electrode substrate includes the following steps:

forming the common electrode on the first substrate;

forming the light guiding poles as light transmitting passages on the common electrode; and coating the other part of the common electrode where no light guiding pole with microcapsule electronic ink.

The step of manufacturing the TFT substrate includes the following steps:

depositing a gate metal film on a substrate, and forming a pattern including first gate lines, second gate lines, third gate lines, common electrode lines, first gate electrodes, second gate electrodes and third gate electrodes by a patterning process, in which each first gate electrode is connected to each first gate line, each second gate electrode is connected to each second gate line, and each third gate electrode is connected to each third gate line respectively;

depositing orderly a gate insulation layer, a semiconductor layer and a doped semiconductor layer on the substrate containing the above pattern, and forming a pattern including the first active layers, the second active layers and the third active layers by a patterning process, in which each first active layer is located over each first gate electrode, each second active layer is located over each second gate electrode, and each third active layer is located over each third gate electrode respectively;

depositing a source/drain metal film on the substrate containing the above patterns, and forming a pattern including data lines, power lines, signal lines, first source electrodes, first drain electrodes, first TFT channel regions, second source electrodes, second drain electrodes, second TFT channel regions, third source electrodes, third drain electrodes and third TFT channel regions by a patterning process, in which each second drain electrode is connected to each third source electrode respectively;

depositing a passivation layer on the substrate containing the above patterns, and forming a patterns including passivation layer via holes by a patterning process, in which each passivation layer via hole is located over each first drain electrode respectively; and depositing a transparent conducting film on the substrate containing the above patterns, and forming a pattern including displaying electrodes in displaying regions respectively by a patterning process, in which each displaying electrode is connected to each first drain electrode through each passivation layer via hole respectively.

Based on the above technical solution, a height of the light guiding poles is 35%-65% of a distance between the TFT substrate and the transparent electrode substrate. Preferably, the height of the light guiding poles is 50% of the distance between the TFT substrate and the transparent electrode substrate.

The present invention provides a touching-type electronic paper and method for manufacturing the same. By disposing the light guiding poles on the transparent electrode substrate as light transmitting passages and disposing the second TFTs on the TFT substrate as light sensor units, the present invention makes the natural lights or other lights outside transmitted to the second TFTs through the light guiding poles, and combines a built-in touch panel with an electronic paper organically, thereby solving with the technical problem that light sensor can not be used to make a touch panel because the natural lights can not reach the TFT substrate when the electronic paper are displaying. The present invention has many advantages such as simple structure, simple manufacturing process and low cost, so as to have a wide application prospect.

BRIEF DESCRIPTION OF THE DRAWINGS

FIG. 10 is a schematic view of a fourth patterning process in the step of manufacturing a TFT substrate according to the present invention; and FIG. 11 is a schematic view of a fifth patterning process in the step of manufacturing a TFT substrate according to the present invention.

In the drawings:

| 11 | first substrate | 12 | common electrode | 13 | light guiding pole |
| 14 | microcapsule electronic ink | 21 | second substrate | 22 | displaying electrode |
| 23 | first TFT | 24 | second TFT | 25 | third TFT |
| 26 | gate insulation layer | 27 | semiconductor layer | 28 | doped semiconductor layer |
| 29 | passivation layer | 231 | first gate electrode | 232 | first source electrode |
| 233 | first drain electrode | 241 | second gate electrode | 242 | second source electrode |
| 243 | second drain electrode | 251 | third gate electrode | 252 | third source electrode |
| 253 | third drain electrode | 291 | passivation layer via hole | 100 | transparent electrode substrate |
| 200 | TFT substrate | | | | |

DETAILED DESCRIPTION

In order to make the objects, technical solutions and merits of the present invention clearer, a further detailed description of embodiments of the present invention is given by reference to accompanying drawings.

Figure 1:
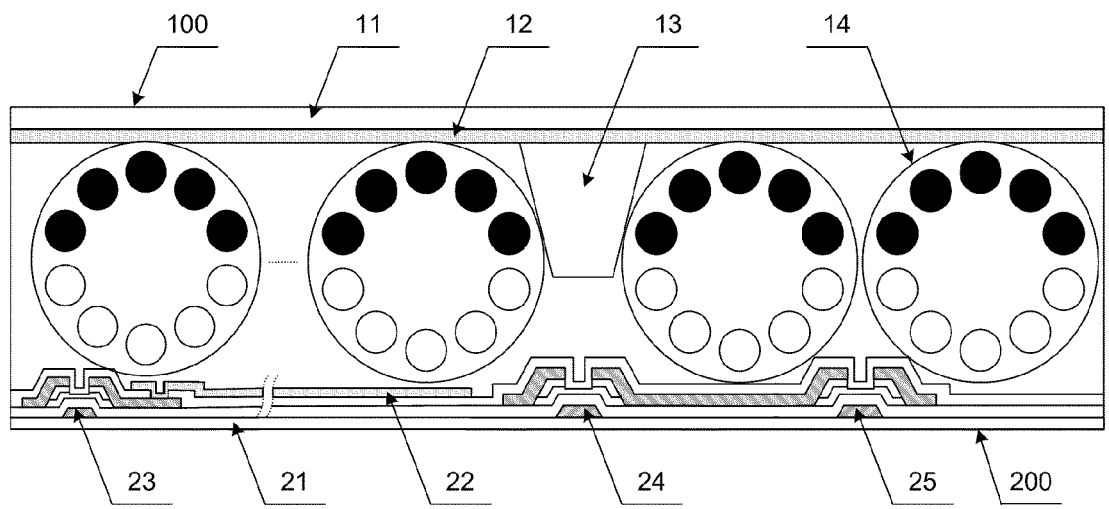
FIG. 1 is a schematic structure view of a touching-type electronic paper according to the present invention.

FIG. 1 is a schematic structure view of a touching-type electronic paper according to the present invention. As shown in FIG. 1, the principal structure of the touching-type electronic paper in the present invention includes a transparent electrode substrate 100 and a TFT substrate 200. The transparent electrode substrate 100 and the TFT substrate 200 are disposed and sealed as a cell to be the touching-type electronic paper in the present invention. The transparent electrode substrate 100 includes a common electrode 12, light guiding poles 13 and microcapsule electronic ink 14 formed on a first substrate 11. The common electrode 12 is formed on the first substrate 11. The light guiding poles 13 are formed on the common electrode 12, and are transparent structures taken as light transmitting passages to make the natural lights outside the transparent electrode substrate 100 to be transmitted to the TFT substrate 200 through the light guiding poles 13. The common electrode 12 is also coated with the microcapsule electronic ink 14. Particularly, the other part of the common electrode 12 where no light guiding pole is coated with the microcapsule electronic ink 14. The TFT substrate 200 includes displaying electrodes 22, first TFTs 23, second TFTs 24 and third TFTs 25 formed on a second substrate 21. The displaying electrodes 22 are formed on the second substrate 21, and used for forming an electric field with the common electrode 12 on the transparent electrode substrate 100 to drive the microcapsule electronic ink 14. The first TFTs 23 are formed on the second substrate 21, which are taken as driving units and used for controlling the voltages of the displaying electrodes 22. The second TFTs 24 are formed on the second substrate 21, which are taken as light sensor units and used for detecting lights transmitting through the light guiding poles 13 and for producing level signals corresponding to the change of the lights. The second TFTs 24 are opposite to the light guiding poles 13 on the transparent electrode substrate 100, that is, the position of the light guiding poles 13 aims at the position of the second TFTs 24. The third TFTs 25 are also formed on the second substrate 21, which are taken as signal reading units and used for reading the level signals of the second TFTs 24 and sending the level signals to a back-end processing system, so as to finally obtain a position of touching point to control displaying of the electronic paper.

In the above technical solution of the present invention, the first substrate of the transparent electrode substrate may be made of a transparent substrate such as a glass substrate or a quartz substrate. The common electrode may be made of a conducting film such as indium tin oxide (ITO) or indium zinc oxide (IZO), and may be deposited by a magnetron sputtering method or a thermal evaporation method. The light guiding poles may be made of a transparent material. The structural of the light guiding poles is similar to the structural of a post spacer (PS) in the conventional liquid crystal display, which are formed by a pattering process. In a particular application, the height of the light guiding poles in the present invention may be set to be 35%-65% of the distance between the TFT substrate and the transparent electrode substrate, that is, the height of the light guiding poles is 35%-65% of a cell thickness of the touching-type electronic paper in the present invention. Preferably, the height of the light guiding poles is 50% of the distance between the TFT substrate and the transparent electrode substrate.

In the above technical solution of the present invention, the TFT substrate includes first gate lines, second gate lines, third gate lines, common electrode lines, data lines, power lines, signal lines, displaying electrodes, the first TFTs as driving units, the second TFTs as light sensor units and the third TFTs as signal reading units. Particularly, the first gate lines and the data lines define the displaying regions together. The first TFTs are formed at the intersections of the first gate lines and the data lines respectively. The second TFTs are formed at the intersections of the second gate lines and the power lines respectively. The third TFTs are formed at the intersections of the third gate lines and the signal lines respectively. The displaying electrodes are formed in the displaying regions respectively. The common electrode lines (also called storage capacitor lines) are also formed in the displaying regions respectively, and are located between two first gate lines. The common electrode lines are used for forming storage capacitors together with the displaying electrodes.

Figure 2:
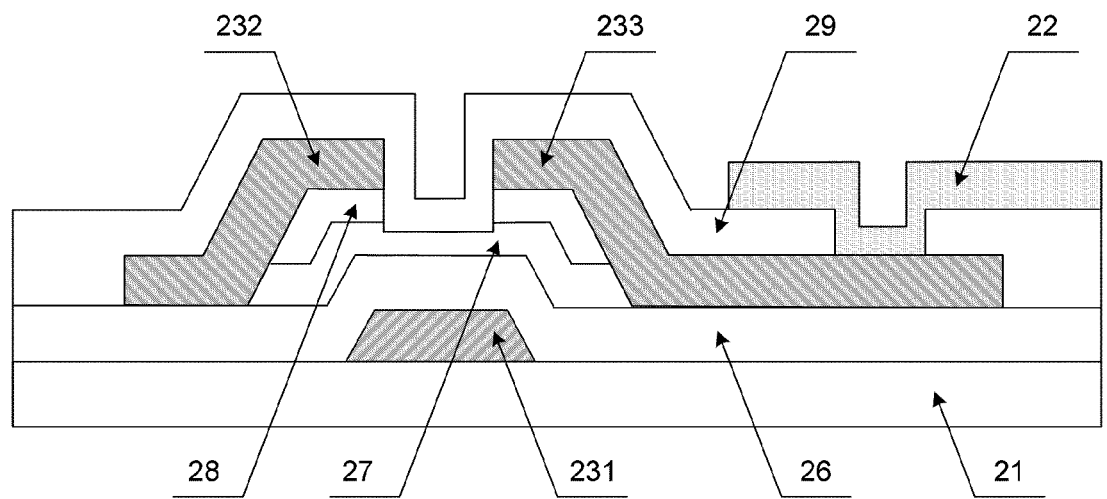
FIG. 2 is a schematic structure view of a first TFT according to the present invention.

FIG. 2 is a schematic structure view of a first TFT according to the present invention. As shown in FIG. 2, each of the first TFTs includes a first gate electrode 231, a gate insulation layer 26, a first active layer (including a semiconductor layer 27 and a doped semiconductor layer 28), a first source electrode 232, a first drain electrode 233 and a passivation layer 29. Each first gate electrode 231 is formed on the second substrate 21 and is connected to each first gate line. The gate insulation layer 26 is formed on first gate electrodes 231 and covers the entire second substrate 21. Each first active layer is formed on the gate insulation layer 26 and is located over each first gate electrode 231. One end of each first source electrode 232 is located on each first active layer, and the other end of each first source electrode 232 is connected to each data line respectively. One end of each first drain electrode 233 is located on the first active layer, and the other end of each first drain electrode 233 is connected to each displaying electrode 22 through each passivation layer via hole respectively. A TFT channel region is formed between each first source electrodes 232 and each first drain electrode 233. The doped semiconductor layer 28 inside of each first TFT channel region is etched off entirely and part of thickness of each semiconductor layer 27 is also etched off. The passivation layer 29 is formed on first TFT channel regions and covers the entire second substrate 21. The passivation layer 29 is provided with passivation layer via holes which are used for connecting the displaying electrodes 22 and the first drain electrodes 233 respectively. The structural of the first TFTs in the present invention is substantially same as the structural of TFTs in the conventional liquid crystal display.

Figure 3:
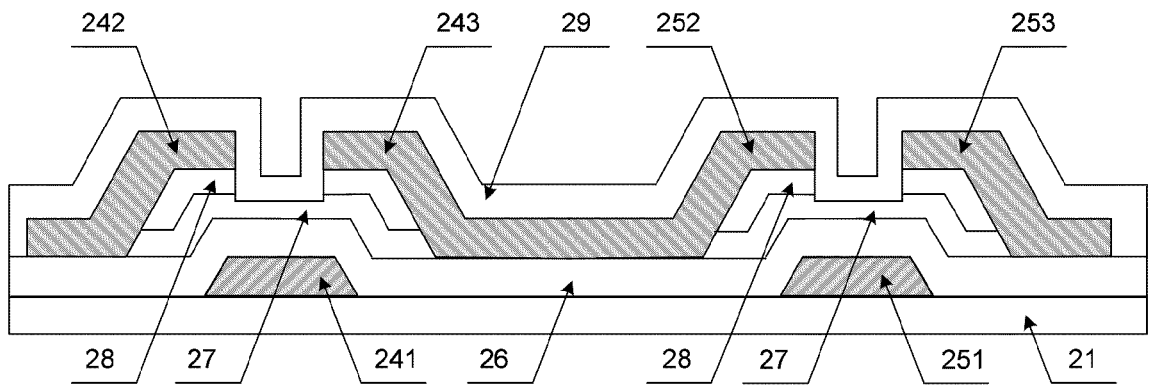
FIG. 3 is a schematic structure view of a second TFT and a third TFT according to the present invention.

FIG. 3 is a schematic structure view of one second TFT and one third TFT according to the present invention. As shown in FIG. 3, each of the second TFTs includes a second gate electrode 241, a gate insulation layer 26, a second active layer (including a semiconductor layer 27 and a doped semiconductor layer 28), a second source electrode 242, a second drain electrode 243 and a passivation layer 29. Each second gate electrode 241 is formed on the second substrate 21 and is connected to each second gate line. The gate insulation layer 26 is formed on each second gate electrode 241 and covers the entire second substrate 21. Each second active layer is formed on the gate insulation layer 26 and is located over each second gate electrode 241. One end of each second source electrode 242 is located on the second active layer, and the other end of each second source electrode 242 is connected to each power line respectively. One end of each second drain electrode 243 is located on each second active layer, and the other end of each second drain electrode 243 is connected to the third source electrode 252 of each third TFT respectively. A second TFT channel region is formed between each second source electrode 242 and each second drain electrode 243 respectively. The doped semiconductor layer 28 inside of each second TFT channel region is etched off entirely, and part of thickness of each semiconductor layer 27 is also etched off. The passivation layer 29 is formed on second TFT channel regions and covers the entire second substrate 21. The power lines are used for providing voltage signals to the second source electrodes 242 respectively, the second TFT channel regions are used for detecting the change of lights to make each second source electrode 242 and each second drain electrode 243 conductive or not.

Each of the third TFTs includes a third gate electrode 251, a gate insulation layer 26, a third active layer (including a semiconductor layer 27 and a doped semiconductor layer 28), a third source electrode 252, a third drain electrode 253 and a passivation layer 29. Each third gate electrode 251 is formed on the second substrate 21 and is connected to each third gate line respectively. The gate insulation layer 26 is formed on each third gate electrode 251 and covers the entire second substrate 21. Each third active layer is formed on the gate insulation layer 26 and is located over each third gate electrode 251 respectively. One end of each third source electrode 252 is located on each third active layer, and the other end of each third source electrode 252 is connected to the second drain electrode 243 of each second TFT respectively. One end of each third drain electrode 253 is located on each third active layer, and the other end of each third drain electrode 253 is connected to each signal line respectively. A third TFT channel region is formed between each third source electrode 252 and each third drain electrode 253 respectively. Each signal line is used for sending the level signal of each second TFT to the back-end processing system.

The working principle of the touching-type electronic paper in the present invention is specifically as following: when there is not any touch-matter touching the surface of the touching-type electronic paper in the present invention, the natural lights or other lights outside the transparent electrode substrate are transmitted to the second TFTs on the TFT substrate through the light guiding poles on the transparent electrode substrate, and the concentration of the photo-induced carriers in each second TFT is not changed; when there is touch-matter such as a finger sweeping the surface of the touching-type electronic paper in the present invention, the natural lights or other lights outside the transparent electrode substrate are held up, which makes the natural lights or other lights can not reach the second TFT on the TFT substrate, and the concentration of the photo-induced carriers in the second TFT is changed, which makes the level signal of the second TFT changed, and the back-end processing system could make certain the position of the touching point by analyzing the level signal, so as to control the displaying of the electronic paper.

The working principle of the first TFTs in the present invention is the same as the TFT of the conventional liquid crystal display, which is unnecessary to go into details. Each second gate line provides a cutting voltage to the second gate electrode of each second TFT in the present invention and each power line provides a forward high level to each source electrode. When there is not any touch-matter touching the surface of the touching-type electronic paper in the present invention, as the natural lights or other lights outside could reach the second TFT channel regions of the second TFTs through the light guiding poles, photo-induced carriers could be produced in the semiconductor layers of the second TFT channel regions. Although the second gate electrodes provide the cutting voltage at this time, the photo-induced carriers existing in the semiconductor layers make the second source electrodes and the second drain electrodes of the second TFTs conducted. Therefore, the second drain electrodes are provided a high level equal to that of the second source electrodes. When a touch-matter such as the finger sweeping the surface of the touching-type electronic paper in the present invention, the natural lights or other lights outside the transparent electrode substrate are held up, which makes the natural lights or other lights can not reach the second TFT on the TFT substrate, and the photo-induced carriers in the semiconductor layer of the second TFT channel region is disappeared. Therefore under the cutting voltage of the second gate electrode, the second source electrode and the second drain electrode of the second TFT could not be conductive. At this time, the level of the second drain electrode is reduced to be a low level. The third gate electrode of each third TFT in the present invention is provided with a turn-on voltage by each third gate line, which makes the third source electrode and the third drain electrode of the third TFT maintain a conduction status. As the source electrode of each third TFT is connected to the second drain electrode of each second TFT, the change of level of the second drain electrode in the second TFT could be outputted to each signal line by the third drain electrode of each third TFT. The back-end process system could analyze and process according to the change of the level, so as to finally obtain the position of the touching point and control the displaying of the electronic paper. It can be seen that the present invention has many advantages such as simple structure, simple manufacturing process and low cost, and has a wide application prospect.

Figure 4:
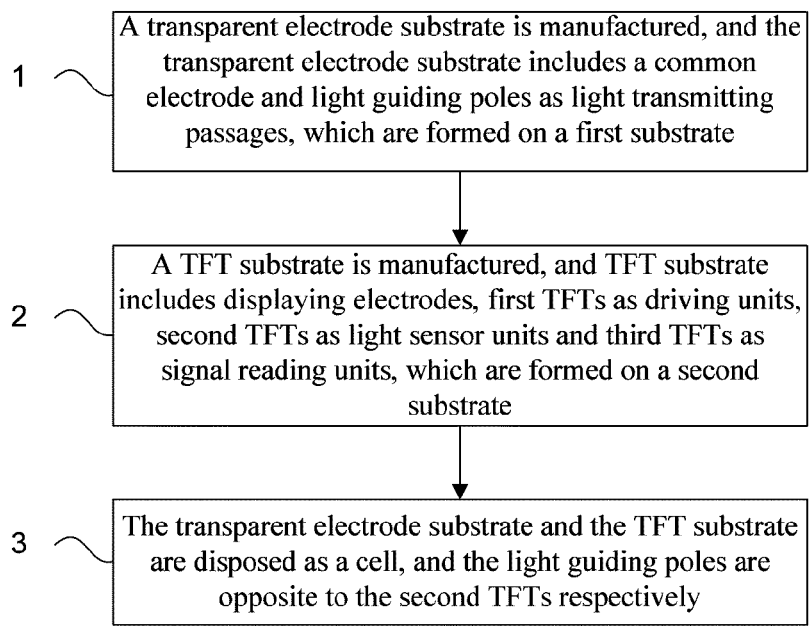
FIG. 4 is a flow chart of a method for manufacturing a touching-type electronic paper according to the present invention.

FIG. 4 is a flow chart of a method for manufacturing a touching-type electronic paper according to the present invention. The method specifically includes the following steps.

In step 1, a transparent electrode substrate is manufactured, and the transparent electrode substrate includes a common electrode and light guiding poles as light transmitting passages, which are formed on a first substrate.

In step 2, a TFT substrate is manufactured, and TFT substrate includes displaying electrodes, first TFTs as driving units, second TFTs as light sensor units and third TFTs as signal reading units, which are formed on a second substrate.

In step 3, the transparent electrode substrate and the TFT substrate are disposed as a cell, in which the light guiding poles are opposite to the second TFTs respectively.

It should be explained that, in the method for manufacturing the touching-type electronic paper in the present invention, the step 1 and step 2 are independent manufacturing processes, and there is not any order relationship between the two steps. The step 1 and step 2 could be executed based on any order according to particular demand.

Figure 5:
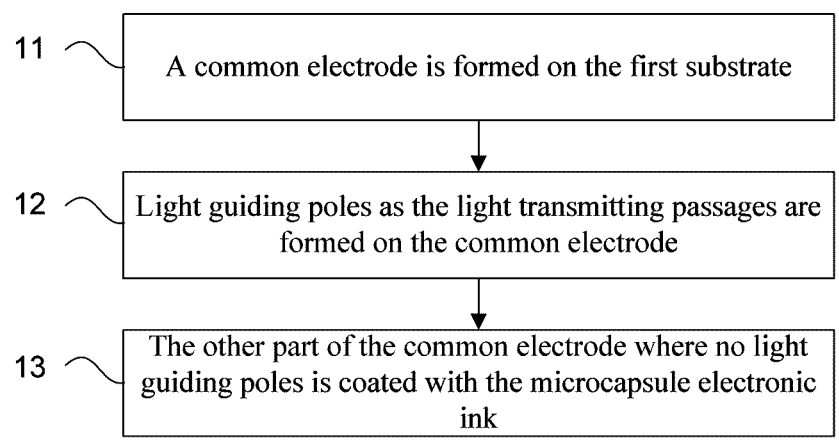
FIG. 5 is a flow chart of manufacturing a transparent electrode substrate in a method for manufacturing a touching-type electronic paper according to the present invention.

FIG. 5 is a flow chart of manufacturing a transparent electrode substrate in a method for manufacturing a touching-type electronic paper according to the present invention. The method specifically includes the following steps.

In step 11, a common electrode is formed on the first substrate.

In step 12, light guiding poles as the light transmitting passages are formed on the common electrode.

In step 13, the other part of the common electrode where no light guiding poles is coated with the microcapsule electronic ink.

During the step of manufacturing the transparent electrode substrate, the first substrate may be made of a transparent substrate such as a glass substrate or a quartz substrate; the common electrode is formed by a magnetron sputtering method or a thermal evaporation method, the common electrode may be made of a conductor film such as ITO or IZO. The manufacturing method for forming light guiding poles on the common electrode is the same as the method for manufacturing the post spacers of the conventional liquid crystal display. The structural of the light guiding poles made of transparent material is similar to the structural of the post spacers in the conventional liquid crystal display. Finally, by coating the other part of the common electrode where no light guiding pole with the microcapsule electronic ink, and by sealing the microcapsule electronic ink to manufacture the transparent electrode substrate in the present invention. The height of the light guiding poles in the present invention may be set to be 35%-65% of the distance between the TFT substrate and the transparent electrode substrate, that is, the height of the light guiding poles is 35%-65% of a cell thickness of the touching-type electronic paper in the present invention. Preferably, the height of the light guiding poles is 50% of the distance between the TFT substrate and the transparent electrode substrate.

Figure 6:
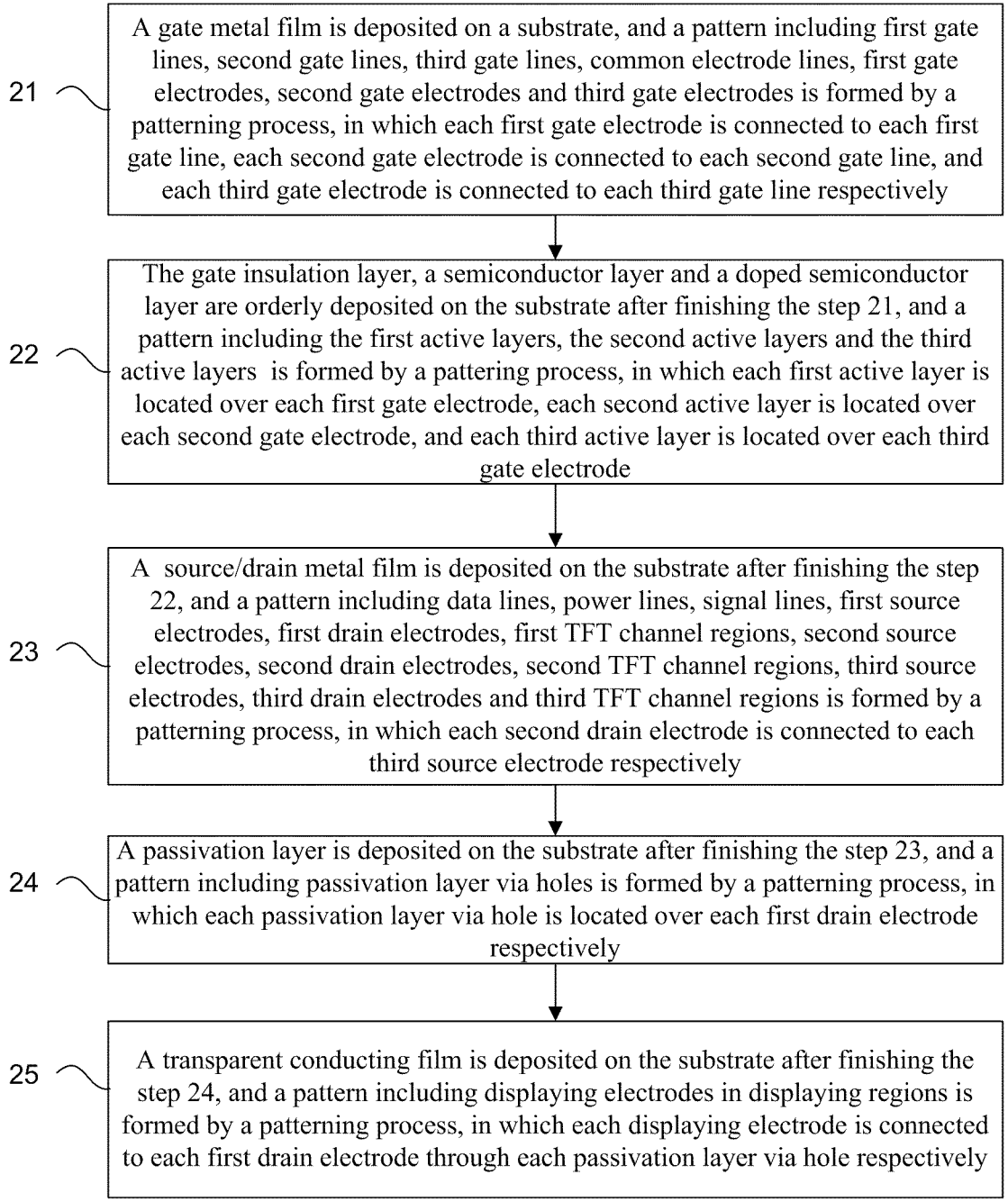
FIG. 6 is a flow chart of manufacturing a TFT substrate in a method for manufacturing a touching-type electronic paper according to the present invention.

FIG. 6 is a flow chart of manufacturing a TFT substrate in a method for manufacturing a touching-type electronic paper according to the present invention. The method specifically includes the following steps.

In step 21, a gate metal film is deposited on a substrate, and a pattern including first gate lines, second gate lines, third gate lines, common electrode lines, first gate electrodes, second gate electrodes and third gate electrodes is formed by a patterning process, in which each first gate electrode is connected to each first gate line, each second gate electrode is connected to each second gate line, and each third gate electrode is connected to each third gate line respectively.

In step 22, the gate insulation layer, a semiconductor layer and a doped semiconductor layer are orderly deposited on the substrate after finishing the step 21, and a pattern including the first active layers, the second active layers and the third active layers is formed by a patterning process, in which each first active layer is located over each first gate electrode, each second active layer is located over each second gate electrode, and each third active layer is located over each third gate electrode.

In step 23, a source/drain metal film is deposited on the substrate after finishing the step 22, and a pattern including data lines, power lines, signal lines, first source electrodes, first drain electrodes, first TFT channel regions, second source electrodes, second drain electrodes, second TFT channel regions, third source electrodes, third drain electrodes and third TFT channel regions is formed by a patterning process, in which each second drain electrode is connected to each third source electrode respectively.

In step 24, a passivation layer is deposited on the substrate after finishing the step 23, and a pattern including passivation layer via holes is formed by a patterning process, in which each passivation layer via hole is located over each first drain electrode respectively.

In step 25, a transparent conducting film is deposited on the substrate after finishing the step 24, and a pattern including displaying electrodes in displaying regions is formed by a patterning process, in which each displaying electrode is connected to each first drain electrode through each passivation layer via hole respectively.

Figure 7:
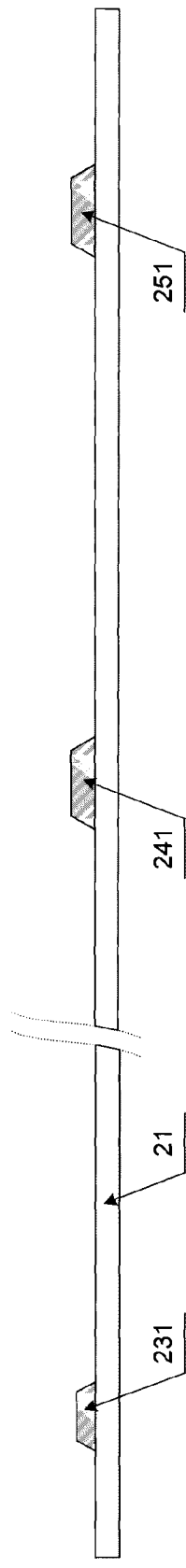
FIG. 7 is a schematic view of a first patterning process in the step of manufacturing a TFT substrate according to the present invention.

FIG. 7 is a schematic view of a first patterning process in the step of manufacturing a TFT substrate according to the present invention. In step 21, firstly, a layer of gate metal film is deposited on the second substrate (for example a glass substrate or a quartz substrate) 21 by a magnetron sputtering method or a thermal evaporation method. The gate metal film may be made of metal such as molybdenum, aluminum, aluminum nickel alloy, molybdenum tungsten alloy, chromium or copper, or may be a multilayer metal film structure composed of the above several materials. The gate metal film is patterned by a first patterning process using a general mask, so as to form the pattern including the first gate lines, the second gate lines, the third gate lines, the common electrode lines, the first gate electrodes 231, the second gate electrodes 241 and the third gate electrodes 251, as shown in FIG. 7. The first gate electrodes 231, the second gate electrodes 241 and the third gate electrodes 251 are taken as gate electrodes of the first TFTs, the second TFTs and the third TFTs. Each first gate electrode 231 is connected to each first gate line respectively, each second gate electrode 241 is connected to each second gate line respectively, and each third gate electrode 251 is connected to each third gate line respectively.

Figure 8:
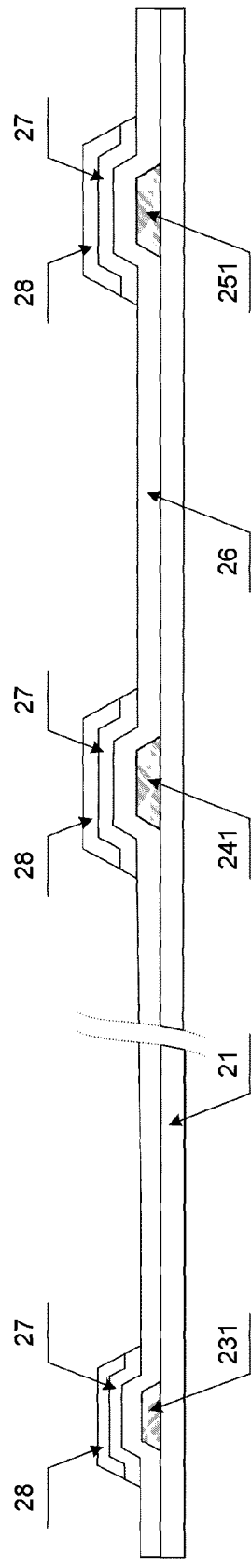
FIG. 8 is a schematic view of a second patterning process in the step of manufacturing a TFT substrate according to the present invention.

FIG. 8 is a schematic view of a second patterning process in the step of manufacturing a TFT substrate according to the present invention. In step 22, on the substrate containing the above pattern, the gate insulation layer 26, the semiconductor layer 27 and the doped semiconductor layer 28 are deposited orderly by plasma enhanced chemical vapor deposition (PECVD) method. The semiconductor layer 27 and the doped semiconductor layer 28 are patterned by the second pattering process using a general mask, so as to form the pattern including the first active layers, the second active layers and the third active layers. Each active layer includes a semiconductor layer 27 and a doped semiconductor layer 28, as shown in FIG. 8. Each first active layer is formed over each first gate electrode 231 respectively, each second active layer is formed over each second gate electrode 241 respectively, and each third active layer is formed over each third gate electrode 251 respectively.

Figure 9:
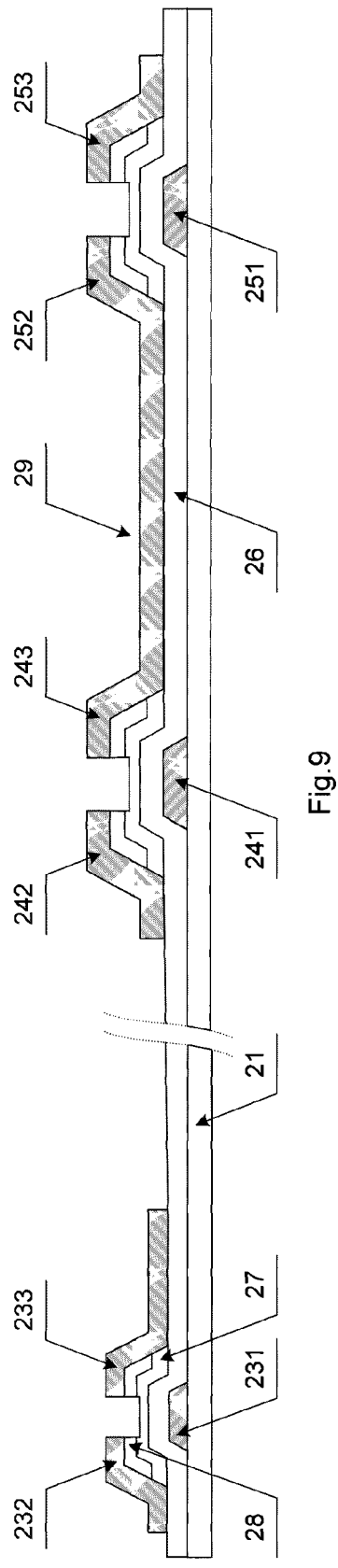
FIG. 9 is a schematic view of a third patterning process in the step of manufacturing a TFT substrate according to the present invention.

FIG. 9 is a schematic view of a third patterning process in the step of manufacturing a TFT substrate according to the present invention. In step 23, on the substrate containing the above pattern, a layer of source/drain metal film is deposited by a magnetron sputtering method or a thermal evaporation method. The source/drain metal film may be made of metals such as molybdenum, aluminum, aluminum nickel alloy, molybdenum tungsten alloy, chromium or copper, or may be multilayer metal film structure composed of the above several materials. The source/drain metal film is patterned by a third patterning process using a general mask, so as to form the pattern including the data lines, the power lines, the signal lines, the first source electrodes 232, the first drain electrodes 233, the second source electrodes 242, the second drain electrodes 243, the third source electrodes 252 and the third drain electrodes 253 at the same time, as shown in FIG. 9. One end of each first source electrode 232 is located on each first active layer, and the other end of each first source electrode 232 is connected to each data line. One end of each first drain electrode 233 is located on each first active layer, and the other end of each first drain electrode 233 is connected to each displaying electrode. The first TFT channel region is formed between each first source electrode 232 and each first drain electrode 233. The doped semiconductor layer 28 inside of each first TFT channel region is etched off entirely and part of thickness of each semiconductor layer 27 is also etched off. One end of each second source electrode 242 is located on each second active layer, and the other end of each second source electrode 242 is connected to each power line. One end of each second drain electrode 243 is located on each second active layer, and the other end of each second drain electrode 243 is connected to each third source electrode 252. The second TFT channel region is formed between each second source electrode 242 and each second drain electrode 243. The doped semiconductor layer 28 inside of each second TFT channel region is etched off entirely, and part of thickness of each semiconductor layer 27 is also etched off. The power lines are used for providing voltage signals to the second source electrodes 242, the second TFT channel regions are used for detecting the change of lights to make each second source electrode 242 and each second drain electrode 243 conductive or not. One end of each third source electrode 252 is located on each third active layer, and the other end of each third source electrode 252 is connected to the second drain electrode 243. One end of each third drain electrode 253 is located on each third active layer, and the other end of each third drain electrode 253 is connected to each signal line. The third TFT channel region is formed between each third source electrode 252 and each third drain electrode 253. The doped semiconductor layer 28 inside of each third TFT channel region is etched off entirely, and part of thickness of each semiconductor layer 27 is also etched off. Each signal line is used for sending the level signal to the back-end processing system.

FIG. 10 is a schematic view of a fourth patterning process in the step of manufacturing a TFT substrate according to the present invention. In step 24, on the substrate containing the above pattern, a passivation layer 29 is deposited by a PECVD method. The passivation layer 29 may be made of silicon nitride, silicon oxide or silicon oxynitride and so on. The passivation layer 29 is patterned by a fourth patterning process using a general mask, so as to form the pattern including the passivation layer via holes 291. Each passivation layer via hole 291 is located over each first drain electrode 233 respectively, as shown in FIG. 10. In this pattering process, first gate line pads, second gate line pads, third gate line pads, data line pads, power line pads, signal line pads and common electrode line pads are formed at the same time. The process of forming the pads by the pattering process using a general mask has been widely applied in the conventional pattering process, it is unnecessary to go into details.

FIG. 11 is a schematic view of a fifth patterning process in the step of manufacturing a TFT substrate according to the present invention. In step 25, on the substrate containing the above pattern, a layer of transparent conducting film is deposited by a magnetron sputtering method or a thermal evaporation method. The transparent conducting film may be made of ITO, IZO or aluminum zinc oxide (AZO) and so on. The transparent conducting film is patterned by the fifth pattering process using a general mask, so as to form the pattern including the displaying electrodes 22 in the displaying regions. Each displaying electrode 22 is connected to each first drain electrode 233 through each passivation layer via hole respectively, as shown in FIG. 11.

The five patterning processes described above is only one accomplishing method for manufacturing the TFT substrate in the present invention. In particular application, the present invention may be also accomplished by adding or reducing one or more of the patterning processes, or by selecting different material or material compound. For example, the above second patterning process and the third patterning process may be combined as one patterning process, and the TFT substrate in the present invention could be formed by multi-step etching processes.

The step of disposing the transparent electrode substrate and the TFT substrate as a cell includes procedures of sealant coating, assembling and so on, It may be any assembling method in the conventional liquid crystal display manufacture to ensure each light guiding pole on the transparent electrode substrate aiming at each second TFT on the TFT substrate. And then the natural lights outside the transparent electrode substrate may transmit to the TFT channel regions of the second TFTs through the light guiding poles.

The present invention provides a touching-type electronic paper and method for manufacturing the same. The present invention makes the natural lights or other lights outside transmitted to the second TFTs of the TFT substrate through the light guiding poles by disposing the light guiding poles as light transmitting passages on the transparent electrode substrate and disposing the second TFTs as light sensor units on the TFT substrate, which combines a built-in type touch panel with an electronic paper organically, thereby solving the technical problem that light sensor can not be used in a touching-type electronic paper panel because the natural lights can not reach the TFT substrate. The present invention has many advantages such as simple structure, simple manufacturing process and low cost, so as to have a wide application prospect.

Finally, it should be noted that the above embodiments are merely provided for describing the technical solutions of the present invention, but not intended to limit the present invention. It should be understood by those of ordinary skill in the art that although the present invention has been described in detail with reference to the foregoing embodiments, modifications can be made to the technical solutions described in the foregoing embodiments, or equivalent replacements can be made to some technical features in the technical solutions, as long as such modifications or replacements do not cause the essence of corresponding technical solutions to depart from the scope of the present invention.

What is claimed is:

1. A touching-type electronic paper, comprising:
a thin film transistor (TFT) substrate and a transparent electrode substrate which are disposed facing each other as a cell,
wherein the transparent electrode substrate comprises a common electrode which is transparent, microcapsule electronic ink and light guiding poles as light transmitting passages, all of which are formed on a first transparent substrate, wherein the common electrode is formed on the first transparent substrate, the light guiding poles made of a transparent material are formed on the common electrode, and the other part of the common electrode, where no light guiding poles are formed, is coated with the microcapsule electronic ink;
the TFT substrate comprises:
displaying electrodes,
first TFTs for driving the displaying electrodes respectively,
second TFTs as light sensor units for detecting lights transmitting through the light guiding poles and for producing level signals respectively, and
third TFTs electrically connected with the second TFTs in which the third TFTs comprise signal reading units for reading the level signals and sending the level signals to a back-end processing system, wherein all of which are formed on a second substrate; and
the light guiding poles are arranged between the microcapsules of the electronic ink, and each light guiding pole comprises one end formed on and contacting the transparent common electrode for receiving external light and the other end opposite to but not touching the corresponding one of the second TFTs, so as to transmit the external light to the corresponding second TFT through the light guiding pole,
wherein the height of a light guiding poles is 50% of the distance between the TFT substrate and the transparent electrode substrate.

2. The touching-type electronic paper according to claim 1, wherein each of the first TFTs comprises:
a first gate electrode formed on the second substrate and connected to a first gate line;
a gate insulation layer formed on the first gate electrode and covering the entire second substrate;
a first active layer comprising a semiconductor layer and a doped semiconductor layer, formed on the gate insulation layer and located over the first gate electrode;
a first source electrode, of which one end is located on the first active layer and the other end is connected to a data line;
a first drain electrode, of which one end is located on the first active layer and the other end is connected to the displaying electrode;
a first TFT channel region formed between the first source electrode and the first drain electrode, wherein the doped semiconductor layer between the first source electrode and the first drain electrode is entirely etched off to expose the semiconductor layer; and
a passivation layer formed on the first source electrode and the first drain electrode, covering the entire second substrate and provided with a passivation layer via hole for connecting the displaying electrode and the first drain electrode.

3. The touching-type electronic paper according to claim 1, wherein each of the second TFTs comprises:
a second gate electrode formed on the second substrate and connected to a second gate line;
a gate insulation layer formed on the second gate electrode and covering the entire second substrate;
a second active layer comprising a semiconductor layer and a doped semiconductor layer, formed on the gate insulation layer and located over the second gate electrode;
a second source electrode, of which one end is located on the second active layer and the other end is connected to a power line;
a second drain electrode, of which one end is located on the second active layer and the other end is connected to a third source electrode of each third TFT;
a second TFT channel region formed between the second source electrode and the second drain electrode, wherein the doped semiconductor layer between the second source electrode and the second drain electrode is entirely etched off to expose the semiconductor layer; and
a passivation layer formed on the second source electrode and the second drain electrode and covering the entire second substrate.

4. The touching-type electronic paper according to claim 1, wherein each of the third TFTs comprises:
a third gate electrode formed on the second substrate and connected to a third gate line; a gate insulation layer formed on the third gate electrode and covering the entire second substrate;
a third active layer comprising a semiconductor layer and a doped semiconductor layer, formed on the gate insulation layer and located over the third gate electrode;
a third source electrode, of which one end is located on the third active layer and the other end is connected to a second drain electrode of each second TFT;
a third drain electrode, of which one end is located on the third active layer and the other end is connected to a signal line;
a third TFT channel region formed between the third source electrode and the third drain electrode, wherein the doped semiconductor layer between the third source electrode and the third drain electrode is entirely etched off to expose the semiconductor layer; and a passivation layer formed on the third source electrode and the third drain electrode and covering the entire second substrate.

* * * * *